(12) United States Patent
Zha

(10) Patent No.: US 10,707,390 B1
(45) Date of Patent: Jul. 7, 2020

(54) AREA LIGHT SOURCE DISPLAY MODULE

(71) Applicant: Wuhan China Star Optoelectronics Technology Co., Ltd., Wuhan (CN)

(72) Inventor: Guowei Zha, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/323,790

(22) PCT Filed: Jan. 10, 2019

(86) PCT No.: PCT/CN2019/071064
§ 371 (c)(1),
(2) Date: Feb. 7, 2019

(87) PCT Pub. No.: WO2020/087779
PCT Pub. Date: May 7, 2020

(30) Foreign Application Priority Data

Oct. 31, 2018 (CN) .......................... 2018 1 1284206

(51) Int. Cl.
*H01L 33/58* (2010.01)
*H01L 33/24* (2010.01)
*G06F 1/16* (2006.01)
*H01L 33/50* (2010.01)
*H01L 25/075* (2006.01)
*H01L 27/15* (2006.01)
*H01L 51/00* (2006.01)

(52) U.S. Cl.
CPC ............ *H01L 33/58* (2013.01); *G06F 1/1652* (2013.01); *H01L 25/0753* (2013.01); *H01L 27/156* (2013.01); *H01L 33/24* (2013.01); *H01L 33/50* (2013.01); *H01L 51/0097* (2013.01)

(58) Field of Classification Search
CPC ............... H01L 51/0097; H01L 27/156; H01L 2933/0083
USPC ............................................. 257/88; 349/71
See application file for complete search history.

(56) References Cited

U.S. PATENT DOCUMENTS

| 2016/0070137 | A1* | 3/2016 | You | G02F 1/133609 349/71 |
|---|---|---|---|---|
| 2018/0110102 | A1* | 4/2018 | Adams | A01G 9/20 |
| 2019/0371230 | A1* | 12/2019 | Zha | G02B 5/0236 |

* cited by examiner

*Primary Examiner* — David Vu
*Assistant Examiner* — Brandon C Fox

(57) ABSTRACT

An area light source display module is provided. The area light source display module includes a substrate and a light emitting diode (LED) array disposed on the substrate. A plurality of LED particles disposed on the LED array emit wide-angle light. Each of the LED particles has a lower light intensity distribution at a center of 0° and a higher light intensity distribution at an off-center polar angle θ. θ ranges between 30 degrees and 80 degrees. The LED array includes LED particles emitting the wide-angle light. Therefore, the area light source module can adopt fewer LEDs at a same thickness of the light source display module with an LED having a common light shape, or the area light source module can have a smaller light mixing distance with the same number of LEDs.

10 Claims, 1 Drawing Sheet

AREA LIGHT SOURCE DISPLAY MODULE

RELATED APPLICATIONS

This application is a National Phase of PCT Patent Application No. PCT/CN2019/071064 having International filing date of Jan. 10, 2019, which claims the benefit of priority of Chinese Patent Application No. 201811284206.6 filed on Oct. 31, 2018. The contents of the above applications are all incorporated by reference as if fully set forth herein in their entirety.

FIELD AND BACKGROUND OF THE INVENTION

The present invention relates to a field of flat displays, and more particularly, to an area light source display module which can be used for a flat display device, such as an organic light emitting diode (OLED).

It is known that technology and standards of living are continuously improving, and wearable smart application devices, such as smart glasses and smart watches, etc., have gradually become a part of people's daily lives. Accordingly, it also promotes to improve components mainly used in wearable smart devices. Display devices are continuously improved and increased in yield.

As for the display devices, width and narrowing of a frame of the display devices are obviously related to an active display area of a display screen. With the same size of the display screen, if the width of the frame is wider, the corresponding active display area is smaller; and if the width of the frame is narrower, the active display area is larger.

In this regard, an upper border frame and left and right border frames of existing display screens have been compressed to very narrow border frames in the art, and it basically meets the requirements of a "full screen" in the market. However, a data line fanout and a reserved integrated circuit (IC) bonding area are disposed at a lower border frame of the display screen, and thus the lower border frame of the display screen is needed to be compressed, which is a technical problem that is urgently needed to be solved.

Accordingly, a circuit on film (COF) is adopted, that is only a Flexible Printed Circuit (FPC) bonding area is reserved in the lower border frame of the display screen, and IC bonding is directly disposed on the FPC. The COF can be applied to compress the lower border frame of the display screen to 3 mm or even 2 mm, but there is still a large gap of less than 1 mm as compared to the left and right border frames of the display screen. Next, how to achieve a narrow border frame around the display screen has become the next major direction in research breakthroughs for the display device.

Currently, small-size display devices are adopted with lateral incoming light. An LED lightbar is disposed at the lower border frame of the display screen. Since the LED has a certain thickness and is used as a point light source, the LED is needed to scatter light evenly through a light guide plate so as to avoid a hotspot phenomenon at a low beam. Thus, a certain light mixing distance is required. The compression of the mixing light distance is usually accompanied by a great attenuation of the backlight efficiency, so that the backlight of the lower border frame of the existing main size liquid crystal module has a certain limitation, for example, about 2 mm.

Therefore, even if the lower border frame of the display screen can be compressed to the same size as the left and right border frame of the display screen, it is still necessary to consider a backlight active display area distance and a distance between a lower edge of the active display area and the lower border frame of the display screen. In the future, when the lower border frame of the display screen is compressed to a very narrow level, the lower border frame of the backlight will be a key point for achieving a full screen, such as an extremely narrow border frame of the display screen.

SUMMARY OF THE INVENTION

An area light source display module is provided by one embodiment of the present invention. A smaller light mixing distance and a thinner area light source module are achieved under a condition of fewer LEDs or the same number of LEDs. Also, the reflectivity of the red-green light band is improved, and a high-efficiency and ultra-thin area light source display module is achieved.

Further, the area light source display module according to one embodiment the present invention can be applied to an OLED display device, but is not limited thereto.

Technical solutions are described as follows.

An area light source display module comprises a substrate and a light emitting diode (LED) array disposed on the substrate, and the LED array is arranged with a plurality of LED particles; and a light emitted by each of the LED particles has a wide-angle light shape, a light intensity at a center of 0° of each of the LED particles is distributed in a range of 30 to 50 candelas, the light intensity at an off-center polar angle θ of each of the LED particles is distributed in a range of 50 to 120 candelas, and θ ranges between 30 degrees and 80 degrees.

In one embodiment of the present invention, a wide-angle light emitted by the LED particles ensures that the area light source module can adopt fewer LEDs at the same thickness of the light source display module as compared to LED emitting light with common shape, or the area light source module can have a smaller light mixing distance with the same number of LED particles and thus a thinner module is achieved.

In another embodiment of the present invention, the LED particles of the LED array comprises an unpackaged flip-chip LED chip, and the LED particles have a flip-chip coplanar anode and cathode structure and are arranged in a dense periodic array.

The LED particles can be unpackaged with mini flip-chip LED chips and are arranged in a dense periodic array so as to reduce center spacing between adjacent LED particles, and an extremely small light mixing distance and a thinner backlight module are accomplished. Therefore, a requirement of small-sized backlight modules (<1 mm) is achieved. Specifically, a size of each of the LED particles of the LED array ranges between 100 μm and 600 μm, and a distance between adjacent LED particles ranges between 100 μm and 1000 μm.

In another embodiment of the present invention, a planar layer is disposed on the LED array and is configured to fill a gap existing between adjacent LED particles of the LED array, and a material of the planar layer has low absorptivity in a visible light band of 380 to 780 nm, for example, less than 10%, or less than 5%, even less than 1% etc., and material used for the planar layer may be silica gel, colorless PI, PMMA, etc., and it may be specifically determined as needed and is not limited.

In another embodiment of the present invention, a band-pass band reverse layer, a fluorescent layer, a diffusion layer, and a brightness enhancing layer are disposed on the planar layer, and the band-pass band reverse layer is configured to pass blue-light photons and reflects green-light photos and red-light photons.

The band-pass band reverse layer is disposed between the planar layer and the fluorescent layer. The blue-light photons emitted by the LED particles passes through band-pass band reverse layer, and some of the blue-light photons are absorbed by the fluorescent layer and thus the blue-light photons are converted into red-green light photons or yellow-light photons. The blue-light photons, red-light photons, and green-light photons are emitted through the diffusion layer and the brightness enhancing layer, and a part angle of the photons emitted through a brightness enhancement film (BEF) and a partial polarization state of the photons emitted through dual brightness enhancement film (DBEF) or advanced polarization conversion film (APCF) are returned to the backlight system for recycling after passing through the brightness enhancing layer. The red-light photons and the green-light photons are re-reflected after contacting band-pass band reverse layer, so that the area light source display module has a higher cycle of return light efficiency. Therefore, the brightness efficiency of the area light source backlight is greatly improved.

In another embodiment of the present invention, he band-pass band reverse layer is a film layer structure. Specifically, the film layer structure is fabricated by laminating stack or coating an inorganic material on a film substrate, or the film layer structure is directly fabricated on a surface of the planar layer.

Due to the principle of wave optics refraction and interference, a light passing through the band-pass band reverse layer exhibits a certain shift angle phenomenon based on a specific optical path and an incident angle of the light. Specifically, the light exhibits a blue shift phenomenon with increase of the incident angle.

Moreover, the area light source display module according to one embodiment the present invention adopts a plurality of LED particles which emits a light having a wide-angle light shape and a band-pass band reverse layer. The band-pass band reverse layer is a film layer structure, and when an incident angle of an incident light on the band-pass band reverse layer is θ, the band-pass band reverse layer has an optimum transmittance and reflectance for the light emitted by the LED particles; when the incident angle is less than θ, the overall transmittance exhibits a red shift with decrease of the incident angle; when the incident angle is greater than θ, the transmittance exhibits a blue shift with increase of the incident angle. Therefore, the maximum light intensity angle of the LED particles strictly matches best cycle return light angle of the band-pass band reverse layer so as to achieve a high brightness efficiency.

An incident angle of the light passing through the band-pass band reverse layer is an included angle between the light passing through the band-pass band reverse layer and a plane of the surface of the band-pass band reverse layer. In the present invention, an incident light is a light emitted by the lower LED particles, and an incident angle of the light emitted by the lower LED particles is an included angle between the light emitted by the lower LED particles and the plane of the surface of the band-pass band reverse layer.

In another embodiment of the present invention, the fluorescent layer can be existed in the form of a film. According to a specific embodiment of the preparation, the fluorescent layer is directly coated on a surface of the metal wire gate layer by hot pressing. Specifically, the fluorescent layer includes fluorescent particles, scattering particles or quantum dots, etc., and it may be specifically determined as needed and is not limited.

As for the FPC substrate according to one embodiment of the present invention, the surface of the substrate is usually coated with a white reflective substrate, and the white reflective substrate has a reflectivity of 70-90%, which is higher than a reflectivity of 99% of the conventional lateral incoming type backlight reflector. Accordingly, A relationship between brightness and reflectivity of the backlight module is greater than a linear growth. It has a significance to improve the reflectivity of the substrate, but it is difficult to obtain a substantial breakthrough for the white substrate under the current process conditions. The band-pass band reverse layer is formed by stacking a plurality of layers with materials having different refractive indexes, and the band-pass band revers characteristic is achieved by principle of wave optics refraction and interference, etc., and the optimal transmittance and reflectance can be more than 95% or even 99%. Therefore, the band-pass band reverse layer is superiority to the white reflective substrate.

As compared to the prior art, the present invention has beneficial effects as follows. An area light source display module is provided by one embodiment of the present invention. A plurality of LED particles disposed on the LED array emits a wide-angle light and thus a large pitch is achieved. In addition, due to the adopted "wide-angle light" emitted by the LED particles, the area light source module can adopt fewer LEDs or the same number of LEDs to achieve a smaller light mixing distance, and thus a thinner module is achieved.

Further, the reflectivity of the red-green light band is improved by disposing a band-pass band reverse layer between the LED array layer and the color conversion layer. The transmittance and reflectivity of the band-pass band reverse layer reach a maximum value at a maximum angle of light flux of wide-angle light emitted by LED. When the angle is less than the maximum angle, the overall spectrum exhibits a red shift characteristic. When the angle is greater than the maximum angle, the overall spectrum exhibits a blue shift characteristic. The above characteristics improve the return light efficiency of the wide-angle light emitted by LED and thereby a high-efficiency and ultra-thin area light source display module according to one embodiment of the present invention is achieved.

BRIEF DESCRIPTION OF THE SEVERAL VIEWS OF THE DRAWINGS

In order to more clearly illustrate embodiments or technical solutions in the present invention, the drawings used in the description of the embodiments or current technology will be briefly described below. Obviously, the drawings in the following description are merely some embodiments of the present invention. A person skilled in the art may also obtain other drawings without any creative efforts.

Figure 1:
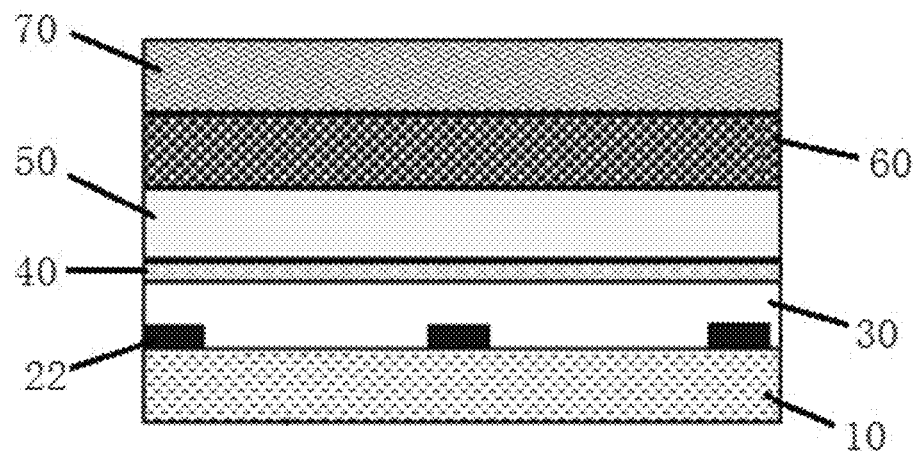
FIG. 1 is a cross-sectional view of an area light source display module according to one embodiment of the present invention.

substrate 10; LED particles 22; planar layer 30; band-pass band reverse layer 40; fluorescent layer 50; diffusion layer 60; and brightness enhancing layer 70.

DESCRIPTION OF SPECIFIC EMBODIMENTS OF THE INVENTION

The technical solution of an area light source display module according to the present invention can be further described in detail below with reference to the accompanying drawings and embodiments.

In one embodiment of the present invention, an area light source display module is provided. The area light source module can adopt less light-emitting diodes (LEDs), or the area light source module can have a smaller light mixing distance and be a thinner one with the same number of LEDs. The reflectivity of the red and green light bands can be improved, and thus an ultra-thin area light source display module having high efficiency is achieved. The area light source display module according to one embodiment of the present invention can be applied to an organic light emitting diode (OLED) display device, but is not limited thereto.

Referring to FIG. 1, an area light source display module includes a substrate 10, an LED array, a planar layer 30, a band-pass band reverse layer 40, a fluorescent layer 50, a diffusion layer 60, and a brightness enhancing layer 70 which are sequentially disposed.

The substrate can be a flexible print circuit (FPC) substrate, a printed circuit board (PCB), or the like. It may be specifically determined as needed and is not limited.

As for the FPC substrate according to one embodiment of the present invention, a surface of the substrate is usually coated with a white reflective substrate, and the white reflective substrate has reflectivity of 70-90%, which is higher than reflectivity of 99% of a conventional lateral incoming type backlight reflector. Accordingly, a relationship between brightness and reflectivity of the backlight module is greater than linear growth. It has significance to improve reflectivity of the substrate, but it is difficult to obtain a substantial breakthrough for a white substrate under current process conditions. The band-pass band reverse layer is formed by stacking a plurality of layers with material having different refractive indexes, and band-pass band revers characteristics are achieved by principles of wave optics refraction and interference, etc., and optimal transmittance and reflectance can be higher than 95% or even 99%. Therefore, the band-pass band reverse layer has more advantages than the white reflective substrate.

The LED array is disposed on the substrate 10, and the LED array is arranged with a plurality of LED particles 22. The LED particles 22 can be unpackaged with mini flip-chip LED chips, and the LED particles 22 have a flip-chip coplanar anode and a cathode structure, and are arranged in a dense periodic array. The area light source module can have an extremely small light mixing distance and a thinner backlight module by reducing center spacing between adjacent LED particles, thereby a requirement of small-sized backlight modules (<1 mm) is achieved.

In one embodiment of the present invention, a size of each of the LED particles of the LED array ranges between 100 μm and 600 μm, and a distance between adjacent LED particles ranges between 100 μm and 1000 μm.

Figure 2:
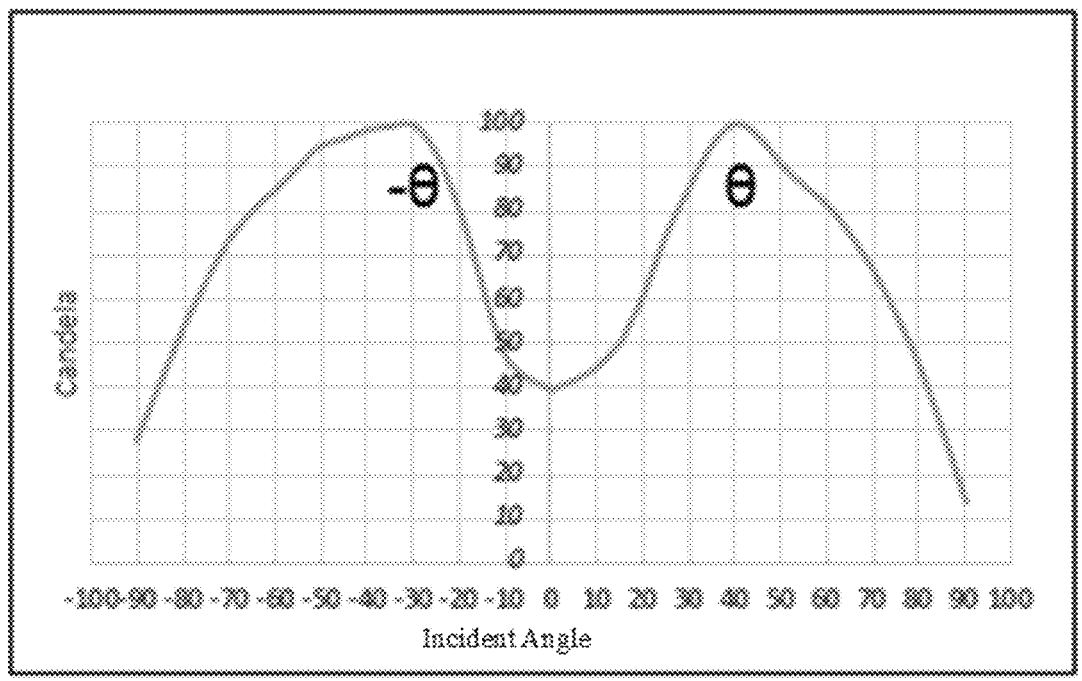
FIG. 2 is a schematic diagram of an area light source display module according to one embodiment of the present invention, which relates to wide-angle light emitted by light-emitting diodes (LED) particles The reference numerals in FIG. 1 and FIG. 2 are described as follows.

Furthermore, each of the LED particles 22 emit light having a wide-angle light shape. Typically, the wide-angle light shape is a shape of a batwing. As shown in FIG. 2, lower light intensity is distributed, for example, in a range of 30 to 50 candelas at a center of 0°. Maximum light intensity is distributed, for example, in a range of 50 to 120 candelas at an off-center polar angle θ, and the θ ranges between 30 degrees and 80 degrees.

Wide-angle light emitted by the LED particles 22 ensures that the area light source module can adopt fewer LEDs at the same thickness of the light source display module as compared to LED emitting light with a common shape, or the area light source module can have a smaller light mixing distance with the same number of LED particles and thus a thinner module is achieved.

Moreover, the planar layer 30 is configured to fill a gap existing between the adjacent LED particles 22 of the LED array, and material of the planar layer has low absorptivity, for example, less than 10% in a visible light band of 380 to 780 nm. Specifically, material used for the planar layer 30 may be silica gel, colorless PI, PMMA, etc., and it may be specifically determined as needed and is not limited.

The band-pass band reverse layer 40 is disposed on the planar layer 30. The band-pass band reverse layer 40 is configured to pass blue-light photons and reflects green-light photons and red-light photons. The fluorescent layer 50, the diffusion layer 60, and the brightness enhancing layer 70 are disposed on the band-pass band reverse layer 40.

The band-pass band reverse layer 40 is disposed between the planar layer 30 and the fluorescent layer 50. The blue-light photons emitted by the LED particles 22 passes through band-pass band reverse layer 30, and some of the blue-light photons are absorbed by the fluorescent layer 50 and thus the blue-light photons are converted into red-green light photons or yellow-light photons. The blue-light photons, red-light photons, and green-light photons are emitted through the diffusion layer 60 and the brightness enhancing layer 70, and a part angle of the photons emitted through a brightness enhancement film (BEF) and a partial polarization state of the photons emitted through a dual brightness enhancement film (DBEF) or an advanced polarization conversion film (APCF) are returned to a backlight system for recycling after passing through the brightness enhancing layer 70. The red-light photons and the green-light photons are re-reflected after contacting the band-pass band reverse layer 40, so that the area light source display module has a higher cycle of return light efficiency. Therefore, the brightness efficiency of the area light source backlight is greatly improved.

Furthermore, in another embodiment of the present invention, the band-pass band reverse layer 40 is a film layer structure. Specifically, the film layer structure is fabricated by a laminating stack or coating an inorganic material on a film substrate, or the film layer structure is directly fabricated on a surface of the planar layer.

Due to the principle of wave optics refraction and interference, light passing through the band-pass band reverse layer 40 exhibits a certain shift angle phenomenon based on a specific optical path and an incident angle of the light. Specifically, the light exhibits a blue shift phenomenon with an increase of the incident angle.

Moreover, the area light source display module according to one embodiment the present invention adopts the plurality of LED particles 22 which emit light having a wide-angle light shape and the band-pass band reverse layer 40. The band-pass band reverse layer 40 is a film layer structure, and when an incident angle (i.e., an included angle between the light emitted by the LED particles and a plane of a surface of the band-pass band reverse layer) of an incident light on the band-pass band reverse layer 40 is θ, the band-pass band reverse layer 40 has optimum transmittance and reflectance for the light emitted by the LED particles; when the incident angle is less than θ, the overall transmittance exhibits a red shift with a decrease of the incident angle; when the incident angle is greater than θ, the transmittance exhibits a blue shift with the increase of the incident angle. In combination with wide-angle light emitted by the LED particles 22, the maximum light intensity angle of the LED 22 particles strictly matches a best cycle return light angle of the band-pass band reverse layer so as to achieve high brightness efficiency.

Furthermore, the fluorescent layer 50 can be existed in the form of a film. According to a specific embodiment of the preparation, the fluorescent layer 50 is directly coated on the surface of the metal wire gate layer by hot pressing. Specifically, the fluorescent layer 50 includes the fluorescent particles, the scattering particles or the quantum dots, etc., and it may be specifically determined as needed and is not limited.

An area light source display module is provided by one embodiment of the present invention. A plurality of LED particles disposed on an LED array emits wide-angle light and thus a large pitch is achieved. In addition, due to adopted light-emitting characteristics of the LED particles, the area light source module can adopt fewer LEDs or the same number of LEDs to achieve a smaller light mixing distance, and thus a thinner module is achieved.

Further, the reflectivity of the red-green light band is improved by disposing a band-pass band reverse layer between an LED array layer and a color conversion layer. Transmittance and reflectivity of the band-pass band reverse layer reach a maximum value at a maximum angle of light flux of the wide-angle light emitted by LED. When an angle is less than the maximum angle, the overall spectrum exhibits a red shift characteristic. When the angle is greater than the maximum angle, the overall spectrum exhibits a blue shift characteristic. The above characteristics improve the return light efficiency of the wide-angle light emitted by the LED and thereby a highly efficient and ultra-thin area light source display module according to one embodiment of the present invention is achieved.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An area light source display module, comprising:
   a substrate; and
   a light emitting diode (LED) array disposed on the substrate, wherein the LED array is arranged with a plurality of LED particles; and
   wherein light emitted by each of the LED particles has a wide-angle light shape, light intensity at a center of 0° of each of the LED particles is distributed in a range of 30 to 50 candelas, light intensity at an off-center polar angle θ of each of the LED particles is distributed in a range of 50 to 120 candelas, and θ ranges between 30 degrees and 80 degrees.

2. The area light source display module according to claim 1, wherein the LED particles of the LED array comprises an unpackaged flip-chip LED chip, and the LED particles have a flip-chip coplanar anode and cathode structure and are arranged in a dense periodic array.

3. The area light source display module according to claim 1, wherein a size of each of the LED particles of the LED array ranges between 100 μm and 600 μm, and a distance between adjacent LED particles ranges between 100 μm and 1000 μm.

4. The area light source display module according to claim 1, further comprising a planar layer disposed on the LED array and is configured to fill a gap existing between the adjacent LED particles of the LED array, and material of the planar layer has absorptivity less than 10% in a visible light band of 380 to 780 nm.

5. The area light source display module according to claim 1, further comprising a band-pass band reverse layer, a fluorescent layer, a diffusion layer, and a brightness enhancing layer disposed on the planar layer, wherein the band-pass band reverse layer is configured to pass blue-light photons and reflects green-light photons and red-light photons.

6. The area light source display module according to claim 5, wherein the band-pass band reverse layer is a film layer structure, and when an incident angle of incident light on the band-pass band reverse layer is θ, the band-pass band reverse layer has optimum transmittance and reflectance; when the incident angle is less than θ, transmittance exhibits a red shift with a decrease of the incident angle; when the incident angle is greater than θ, the transmittance exhibits a blue shift with an increase of the incident angle.

7. The area light source display module according to claim 6, wherein the film layer structure of the band-pass band reverse layer is directly fabricated on a surface of the planar layer.

8. The area light source display module according to claim 6, wherein the film layer structure of the band-pass band reverse layer is fabricated by a laminating stack or coating an inorganic material on a film substrate.

9. The area light source display module according to claim 5, wherein the fluorescent layer is a film structure and comprises at least one of fluorescent particles, scattering particles, and quantum dots.

10. The area light source display module according to claim 1, wherein the substrate comprises one of a flexible print circuit (FPC) substrate and a printed circuit board (PCB).

* * * * *